United States Patent [19]

Hotta

[11] Patent Number: 5,717,637
[45] Date of Patent: Feb. 10, 1998

[54] SEMICONDUCTOR MEMORY DEVICE

[75] Inventor: Yasuhiro Hotta, Nara, Japan

[73] Assignee: Sharp Kabushiki Kaisha, Japan

[21] Appl. No.: 666,238

[22] Filed: Jun. 20, 1996

[30] Foreign Application Priority Data

Feb. 22, 1996 [JP] Japan ................. 8-35294

[51] Int. Cl.$^6$ ............................ G11C 8/00
[52] U.S. Cl. ............... 365/189.02; 365/189.05; 365/238.5
[58] Field of Search ............ 365/238.5, 189.02, 365/189.05, 221

[56] References Cited

U.S. PATENT DOCUMENTS

| | | | |
|---|---|---|---|
| 4,887,242 | 12/1989 | Hashimoto | 365/238.5 |
| 5,257,235 | 10/1993 | Miyamoto | 365/238.5 X |

FOREIGN PATENT DOCUMENTS

| | | |
|---|---|---|
| 5-12895 | 1/1993 | Japan. |
| 8-63990 | 3/1996 | Japan. |

*Primary Examiner*—Joseph A. Popek
*Attorney, Agent, or Firm*—Morrison & Foerster

[57] ABSTRACT

The semiconductor memory device includes two sense amplifiers provided corresponding to data lines and a switching circuit for selectively connecting any two among the data lines to the two sense amplifiers, respectively. The data stored in one of the memory cells is amplified to be transmitted to an output buffer via the data line connected to one of the sense amplifiers. In parallel with this operation, the data stored in a next memory cell is amplified via the data line connected to another sense amplifier so as to be made valid. In this manner, after the data stored in one of the memory cell is transmitted to the output buffer, the data stored in the next memory cell is subsequently transmitted to the output buffer.

12 Claims, 7 Drawing Sheets

SEMICONDUCTOR MEMORY DEVICE

BACKGROUND OF THE INVENTION

1. Field of the Invention

The present invention relates to a semiconductor memory device employing a high-speed read-out mode.

2. Description of the Related Art

As the operation speed of microprocessors becomes higher, there is increasing demand for semiconductor memory devices capable of operating at a higher speed. Accordingly, semiconductor memory devices have been developed which are capable of rapidly performing a normal random access operation in a normal mode as well as performing in a high-speed read-out mode referred to as a page mode or a burst mode.

As one example of the semiconductor memory devices employing such a high-speed read-out mode, a mask read-only memory (ROM) having a circuit configuration shown in FIG. 4 is conventionally employed (hereinafter, referred to as the first conventional example).

In this mask ROM, when one of row selecting lines (word lines) $WL_j$ and one of column selecting lines $C_i$ are specified by decoding higher-order bits of an input address, a plurality of memory cells 2 (which are n+1 memory cells in FIG. 4) corresponding to the remaining lower-order bits of the input address are simultaneously selected. Hereinafter, a group of the memory cells 2 thus simultaneously selected is referred to as a page.

Each of the memory cells 2 is constituted using one MOSFET (hereinafter, referred to simply as the transistor) $Qij_0$ to $Qij_n$. Each of the transistors $Qij_0$ to $Qij_n$ is constituted using the semiconductor fabrication process, so that a threshold voltage thereof is boosted in the case where a logic state of "1" is to be stored therein while the threshold voltage becomes the same level as that in a normal enhancement mode in the case where a logic state of "0" is to be stored.

Thus, when one of the row selecting lines (the word lines) $WL_j$ is specified to be set at the "High" level, the transistors $Qij_0$ to $Qij_n$ of the corresponding memory cells 2 are set to be in a normally OFF state ("1") or in a normally ON state ("0") in accordance with the logic states thereof. When one of the column selecting lines $C_i$ is specified to turn on a plurality of the transistors $Qi_0$ to $Qi_n$ of the column selecting circuit 1, the transistors $Qij_0$ to $Qij_n$ of the memory cells 2 selected by the row selecting line $WL_j$ are connected to sense amplifiers (sense amplifier circuits) $S_0$ to $S_n$, respectively. The transistors $Qij_0$ to $Qij_n$ are connected to the transistors $Qi_0$ to $Qi_n$ via bit lines $Bi_0$ to $Bi_n$, respectively, while the transistors $Qi_0$ to $Qi_n$ are in turn connected to the sense amplifiers $S_0$ to $S_n$ via data lines $D_0$ to $D_n$, respectively. Potentials of each of the bit lines $Bi_0$ to $Bi_n$ thus selected by the column selecting line $C_i$ gradually change to be at the High level ("1") or at the Low level ("0") in accordance with the logic states of the respective transistors $Qij_0$ to $Qij_n$. These very small potentials are amplified by the sense amplifiers $S_0$ to $S_n$ to be made valid.

In the case where a normal random access operation is performed in a normal mode, one of word selecting lines $W_0$ to $W_n$ is specified to be set at the High Level in accordance with the lower-order bits of the input address. Then, one of transistors $Qp_0$ to $Qp_n$ of a switching circuit 4 which are respectively connected to the sense amplifiers $S_0$ to $S_n$, for example, a transistor $Qp_0$ connected to the word line $W_0$ and switched to the High level, is turned ON. An output of the sense amplifier $S_0$ connected to the bit line $Bi_0$ is sent to an output buffer 5 via the transistor $Qp_0$. In the above manner, during the normal random access operation, the logic state (i.e., the data) stored in one of the memory cells 2 specified by the input address is read out via the output buffer 5.

Furthermore, in the case where the data stored in one of the memory cells 2 is thus read out via one bit line, for example, the bit line $Bi_0$ as described above, the potentials of the remaining bit lines $Bi_1$ to $Bi_n$ which are not selected by the switching circuit 4 have been already made valid by the sense amplifiers $S_1$ to $S_n$, respectively. Thus, when the other word selecting lines $W_1$ to $W_n$ are selectively changed to the High level under these circumstances, the data are immediately read out from the corresponding memory cells 2 without waiting until the potentials of the bit lines $Bi_1$ to $Bi_n$ are made valid.

FIG. 5 is a timing chart for illustrating the read-out operation described above.

As shown in a portion (a) of FIG. 5, when an input address (higher-order address) is made valid at time t10, one of the column selecting lines $C_i$ and one of the row selecting lines $WL_j$ are specified in accordance with the input address so as to be set at the High level (see portions (c) and (d) of FIG. 5). Then, the bit lines $Bi_0$ to $Bi_n$ are connected to the sense amplifiers $S_0$ to $S_n$, respectively, thereby changing potentials of the bit lines $Bi_0$ to $Bi_n$ as well as corresponding output potentials of the sense amplifiers $S_0$ to $S_n$. The potentials of the bit lines $Bi_0$ to $Bi_n$ as well as the corresponding output potentials of the sense amplifiers $S_0$ to $S_n$ are made valid at time t11 (see portions (e) and (f) of FIG. 5). Since at time t11, the word selecting line $W_0$ has already been specified as described above to be at the "High" level (see a portion (g) of FIG. 5), the output of the sense amplifier $S_0$ connected to the bit line $Bi_0$ is sent to the output buffer 5 (see a portion (j) of FIG. 5). At time t12 when the state of the word selecting line $W_1$ is changed to the "High" level while the word selecting line $W_0$ is changed to the "Low" level, the output of the sense amplifier $S_1$ connected to the bit line $Bi_1$ is sent to the output buffer 5.

Subsequently, the word selecting lines $W_2$ to $W_n$ are successively set at the High level, whereby the outputs of the sense amplifiers $S_2$ to $S_n$ connected to the respective bit lines $Bi_2$ to $Bi_n$ are successively sent to the output buffer 5 (see a portion (3) of FIG. 5).

In accordance with the above operation timing, the read-out of data from the first memory cell 2 constituted by using the transistor $Qij_0$ requires a certain time period (t11–t10) for making the potential of the bit line $Bi_0$ valid, similarly with in the case where the normal random access operation is performed in a normal mode. In the subsequent operations, however, since the potentials of the simultaneously selected other bit lines $Bi_1$ to $Bi_n$ have been already made valid and have been output from the respective sense amplifiers $S_1$ to $S_n$, the data stored in the remaining memory cells 2 constituted by using the corresponding transistors $Qij_1$ to $Qij_n$ can be immediately read out by selecting the word selecting lines $W_1$ to $W_n$.

According to the above-explained mask ROM in the first conventional example, the read-out the data stored in the second and following memory cells in the same page merely requires time necessary for switching outputs of the sense amplifiers $S_1$ to $S_n$ to be sent to the output buffer 5. As a result, the data can be read out at an extremely high speed.

However, in order to provide a high-speed readout mode for the mask ROM in the first conventional example, it is necessary to provide the sense amplifiers $S_0$ to $S_n$ on the respective data lines $D_0$ to $D_n$ which are simultaneously selected by one of the column selecting lines $C_i$. Consequently, in order to realize a high-speed read-out, the number of sense amplifiers to be provided has to increase in accordance with the increase in the number of bits to be simultaneously read out. This adversely results in a remarkable increase in the area occupied by a chip as well as an increase in the power consumption.

For solving the aforementioned problem involved in the first conventional example, the applicant of the present invention has proposed a semiconductor memory device which is disclosed in Japanese Laid-Open Patent Publication No. 5-12895 (hereinafter, referred to as the second conventional example).

This semiconductor memory device includes only one sense amplifier for a plurality of data lines which correspond to one page. The data lines are selectively connected to the sense amplifier so as to read out data in one page. The read-out operation of the semiconductor memory device in the second conventional example will be described in detail below with reference to FIGS. 6 and 7.

The configuration of the semiconductor memory device will be described first. A plurality of memory cells 2 are connected at the respective intersections of n (normally eight) data lines $D_0$ to $D_n$ and the row selecting line $WL_j$. The data lines $D_0$ to $D_n$ are connected to a single sense amplifier S via the column selecting circuit 1 and the switching circuit 4. The data lines $D_0$ to $D_n$ are also connected to a corresponding number of load circuits 6 via the column selecting circuit 1, respectively. The column selecting circuit 1 is provided with n selecting transistors $Qi_0$ to $Qi_n$ for one column selecting line $C_i$.

As in the first conventional example, each of the memory cells 2 is constituted by using one MOSFET (hereinafter, referred to simply as the transistor) $Qij_0$ to $Qij_n$. Each of the transistors $Qij_0$ to $Qij_n$ is constituted using the semiconductor fabrication process, so that a threshold voltage thereof is boosted in the case where a logic state of "1" is to be stored therein while the threshold voltage becomes the same level as that in a normal enhancement mode in the case where a logic state of "0" is to be stored. Thus, when one of the row selecting lines $WL_j$ is specified to be set at the "High" level, the transistors $Qij_0$ to $Qij_n$ of the corresponding memory cells 2 are set to be in a normally OFF state ("1") or in a normally ON state ("0") in accordance with the logic states thereof. When one of the column selecting lines $C_i$ is specified to turn on a plurality of the transistors $Qi_0$ to $Qi_n$ of the column selecting circuit 1, the transistors $Qij_0$ to $Qij_n$ of the memory cells 2 selected by the row selecting line $WL_j$ are connected to the sense amplifier S. Potentials of each of the bit lines $Bi_0$ to $Bi_n$ thus selected by the column selecting line $C_i$ gradually change to be at the High level ("1") or at the Low level ("0") in accordance with the logic states of the respective transistors $Qij_0$ to $Qij_n$. These very small potentials are transmitted to the data lines $D_0$ to $D_n$ via a plurality of transistors $Qi0$ to $Qin$ of the row selecting circuit 1, respectively.

In the above configuration, when one of the row selecting lines $WL_j$ and one of the column selecting lines $C_i$ are specified to simultaneously select a plurality of memory cells 2, the potentials of the data lines $D_0$ to $D_n$ respectively connected to the memory cells 2 gradually change by the respective load circuits 6 in accordance with ON/OFF state of the memory cells 2. When the potentials of the data lines $D_0$ to $D_n$ are made valid, the data lines $D_0$ to $D_n$ are selectively connected to the sense amplifier S by the switching circuit 4.

Owing to such a configuration, in order to read out the data stored in the first memory cell 2, a time period for making the potential of, for example, the data line $D_0$ valid is required. However, since the potentials of the other data lines $D_1$ to $D_n$ have been already made valid, the data stored in the remaining memory cells 2, which are simultaneously selected, can be immediately read out at a high speed by amplifying the potentials of the other data lines $D_1$ to $D_n$.

The sense amplifier S is generally constituted by using a complicated circuit such as a differential amplifying circuit. Therefore, the sense amplifier S occupies a large area on the chip as well as leads to an increase in the power consumption. On the other hand, each of the load circuits 6 has a simple configuration because it is sufficient to provide one transistor for each of the data lines $D_0$ to $D_n$ to constitute one load circuit 6. Therefore, the chip area occupied by the load circuits 6 is small and only a small power is consumed. Accordingly, in the semiconductor memory device in the second conventional example, the required number of sense amplifiers is reduced to one by using the load circuits 6. Thus, the chip area and the power consumption can be reduced.

In the above configuration of the second conventional example, when one of the row selecting lines $WL_j$ and one of the column selecting lines $C_i$ are specified by decoding the higher-order bits of the input address, a plurality of memory cells 2 corresponding to the remaining lower-order bits of the input address are simultaneously selected. In the case where a normal random access operation is performed in a normal mode, one of the word selecting lines $W_0$ to $W_n$ is specified to be at the High level in accordance with the lower-order bits of the input address. Then, only any one of the transistors $Qp_0$ to $Qp_n$ of the switching circuit 4, for example, the transistor $Qp_0$ is turned ON, thereby selectively connecting the corresponding data line $D_0$ to the sense amplifier S. Thus, during the normal random access operation, the logic state, i.e., the data stored in one of the memory cells 2 specified by the input address can be exclusively read out via the output buffer 5.

Furthermore, when the data is thus read out from the one of the memory cells 2 via one bit line, for example, the bit line $Bi_0$ and the data line $D_0$ as described above, the potentials of the other data lines $D_1$ to $D_n$ have been already made valid for the corresponding memory cells 2 which are not selected by the switching circuit 4. Consequently, when the other word selecting lines $W_1$ to $W_n$ are set at the High level under this condition, the data stored in the remaining memory cells 2 can be immediately read out by amplifying the potentials of the other data lines $D_0$ to $D_n$ by the sense amplifier S without waiting until the potentials of these data lines $D_0$ to $D_n$ are made valid. This results from the fact that the potentials of the data lines $D_0$ to $D_n$ have already been made valid.

The timing of the read-out operation of the semiconductor memory device in the second conventional example described above will be described in detail with reference to FIG. 7.

As shown in a portion (a) of FIG. 7, an input address (higher-order address) is made valid at time t10, and one of the column selecting lines $C_i$ and one of the row selecting lines $WL_j$ are specified in accordance with the valid input address to be at the High level (see portions (c) and (d) of FIG. 7). Then, the bit lines $Bi_0$ to $Bi_n$ are respectively connected to the data lines $D_0$ to $D_n$. As a result, the potentials of the data lines $D_0$ to $D_n$ are changed by the memory cells 2 and the load circuits 6, and made valid at time t11 (see portions (h), (i) and (j) of FIG. 7). Since at time t11, the word selecting line $W_0$ has been already selected to be at the High level (see a portion (e) of FIG. 7), the data stored in one of the memory cells 2 constituted by using the particular transistor $Qij_0$ connected to the bit line $Bi_0$ is output at time t12 (see a portion (k) of FIG. 7). Thereafter, at time t14, the word selecting line $W_1$ is set at the High level while the word selecting line $W_0$ is set at the Low level (see a portion (f) of FIG. 7). The sense amplifier S then amplifies the potential of the data line $D_1$ which has been already made valid. As a result, the data stored in one of the memory cells 2 constituted by using the transistor $Qij_1$ connected to the bit line $Bi_1$ is output from the sense amplifier S at time t15 (see a portion (k) of FIG. 7).

Subsequently, the word selecting lines $W_2$ to $W_n$ are successively set at the High level to read out the data stored in the corresponding memory cells 2 connected to the respective bit lines $Bi_2$ to $Bi_n$.

In the semiconductor memory device according to the second conventional example, a delay time period in reading out the data stored in the same page is mainly determined in accordance with a sensing time, that is, the sum of a delay time period related to the sense amplifier S and a delay time period related to the output buffer circuit 5 based on the data lines $D_0$ to $D_n$. In this case, the potentials of the data lines $D_0$ to $D_n$ have been already made valid. Consequently, a time period for a change in the potentials of the data lines $D_0$ to $D_n$ is not required, unlike in the case where the normal random access operation is performed. Accordingly, the sensing time is remarkably reduced.

However, in the conventional semiconductor memory device according to the second conventional example, the sum of the delay time period related to the sense amplifier S and the delay time period related to the output buffer circuit 5 is equal to the delay time period required for reading out the data in one page. Since only the delay time period related to the sense amplifier S is remarkably reduced in the semiconductor memory device described above, there is yet room for improvement in the configuration of the semiconductor memory device in order to increase the reading speed.

SUMMARY OF THE INVENTION

According to one aspect of the invention, a semiconductor memory device includes: a plurality of data lines; a plurality of column selecting lines, each of the column selecting lines being electrically connected to each of the data lines; a plurality of row selecting lines, each of the row selecting lines being electrically connected to each of the data lines; a plurality of memory cells arranged in a matrix, each of the memory cells being electrically connected to one of the data lines, one of the column selecting lines and one of the row selecting lines, wherein upon specifying a selected one of the row selecting lines and a selected one of the column selecting lines, a certain number of the memory cells are simultaneously selected; a plurality of load circuits, each of the load circuits being electrically connected to one of the data lines; two sense amplifier circuits; and a switching circuit for selectively connecting any two of the plurality of data lines electrically to the two sense amplifier circuits, respectively.

Preferably, the semiconductor memory device further includes an output selecting means for selectively outputting an output signal of one of the two sense amplifier circuits.

According to another aspect of the invention, a semiconductor memory device includes: a plurality of data lines; a plurality of column selecting lines, each of the column selecting lines being electrically connected to each of the data lines; a plurality of row selecting lines, each of the row selecting lines being electrically connected to each of the data lines; a plurality of memory cells arranged in a matrix, each of the memory cells being electrically connected to one of the data lines, one of the column selecting lines and one of the row selecting lines; a plurality of load circuits, each of the load circuits being electrically connected to one of the data lines; two sense amplifier circuits; and a switching circuit electrically connected to the plurality of data lines and to the two sense amplifier circuits.

Specifically, the switching circuit is configured for selectively connecting any two of the plurality of data lines electrically to the two sense amplifier circuits, respectively.

Preferably, the semiconductor memory device further includes an output selector electrically connected to the two sense amplifier circuits.

Specifically, the output selector is configured for selectively outputting an output signal of one of the two sense amplifier circuits.

Specifically, in the semiconductor memory device, upon specifying a selected one of the row selecting lines and a selected one of the column selecting lines, a certain number of the memory cells are simultaneously selected.

According to the aforementioned configuration of the present invention, in the case where the data in one page is to be successively read out, a predetermined switching transistor (or any other equivalent component thereof) in the switching circuit is selected using an input address. One data line having a valid potential is connected to one of the sense amplifier circuits via the thus selected switching transistor, thereby reading out the data. On the other hand, another switching transistor corresponding to a next address is selected, thereby connecting the particular data line having the valid potential to the other sense amplifier circuit. Owing to such a circuit configuration, a sense amplifier can operate based on the valid data line in parallel with the operation of an output buffer circuit receiving an output of the sense amplifier circuit. Therefore, according to the present invention, the total delay time period can be remarkably reduced as compared with the aforementioned second conventional example where the delay time period is equal to the sum of delay time period related to the sense amplifier circuit and the delay time period related to the output buffer.

The parallel operation can be easily achieved by providing an output selector circuit such as a multiplexer circuit between the two sense amplifiers and the output buffer.

Additionally, according to the above configuration of the present invention, it is sufficient to provide two sense amplifier circuits for the semiconductor memory device. Thus, the chip area and power consumption can be reduced as compared with the semiconductor memory device of the aforementioned first conventional example.

Thus, the invention described herein makes possible the advantage of providing a semiconductor memory device capable of reducing an area occupied by the chip as well as a power to be consumed by the chip, and further capable of reading out data at an improved high speed.

This and other advantages of the present invention will become apparent to those skilled in the art upon reading and understanding the following detailed description with reference to the accompanying figures.

DESCRIPTION OF THE PREFERRED EMBODIMENTS

The present invention will be described by way of illustrative examples with reference to drawings.

Figure 1:
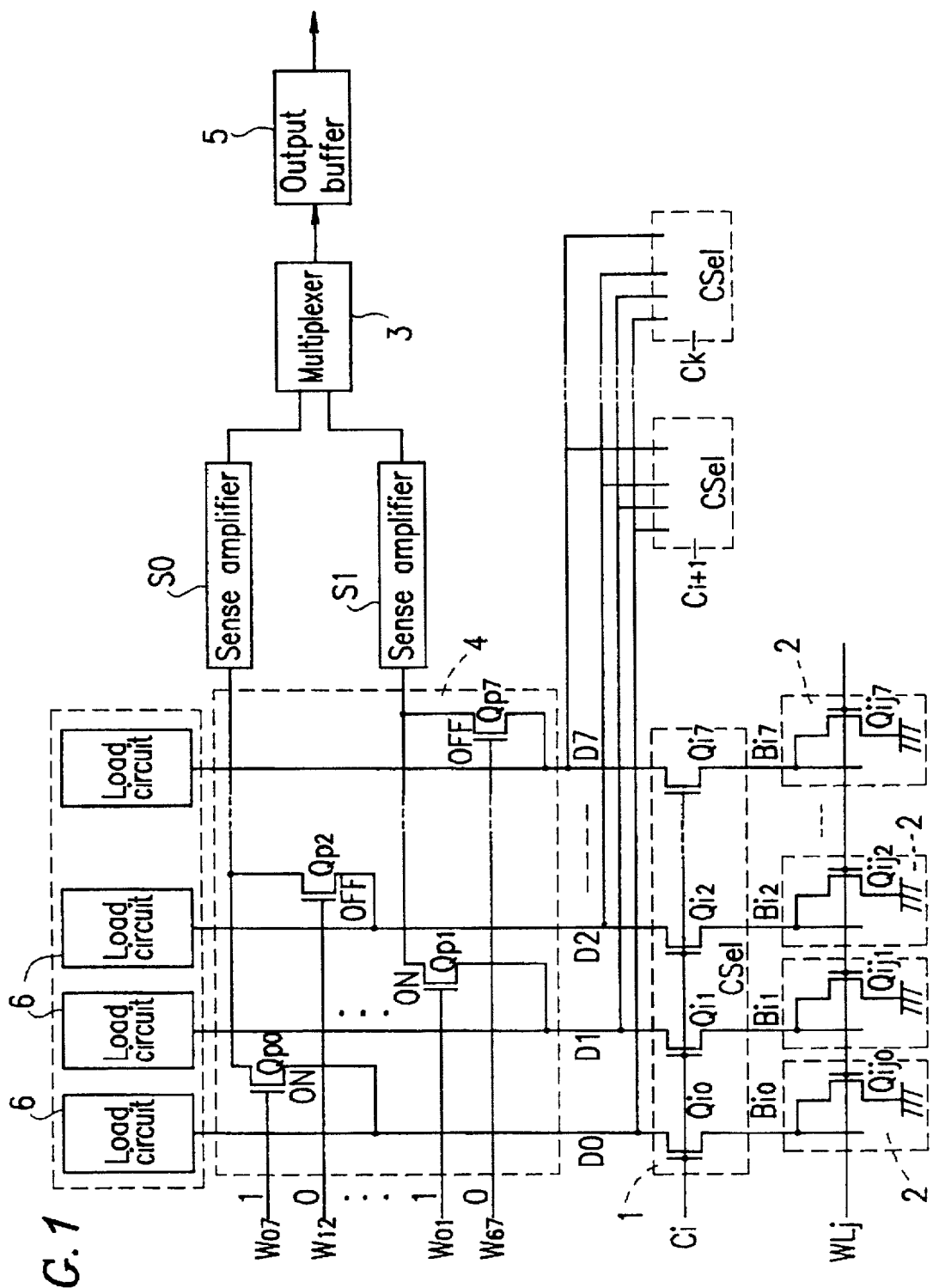
FIG. 1 is a circuit diagram showing the configuration of a semiconductor memory device according to the present invention.
Figure 2:
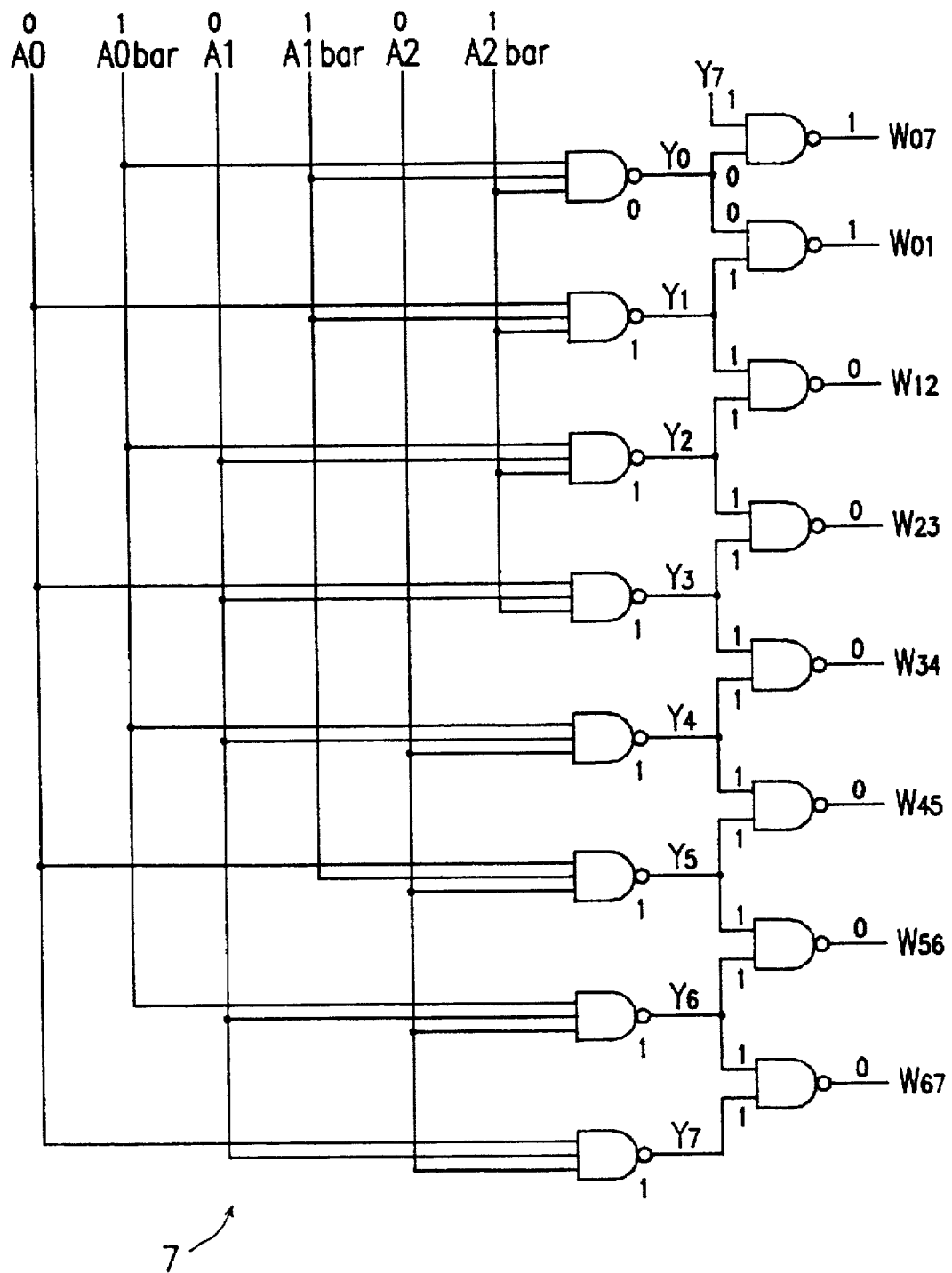
FIG. 2 is a diagram showing a decoder employed in the semiconductor memory device according to the present invention.
Figure 3:
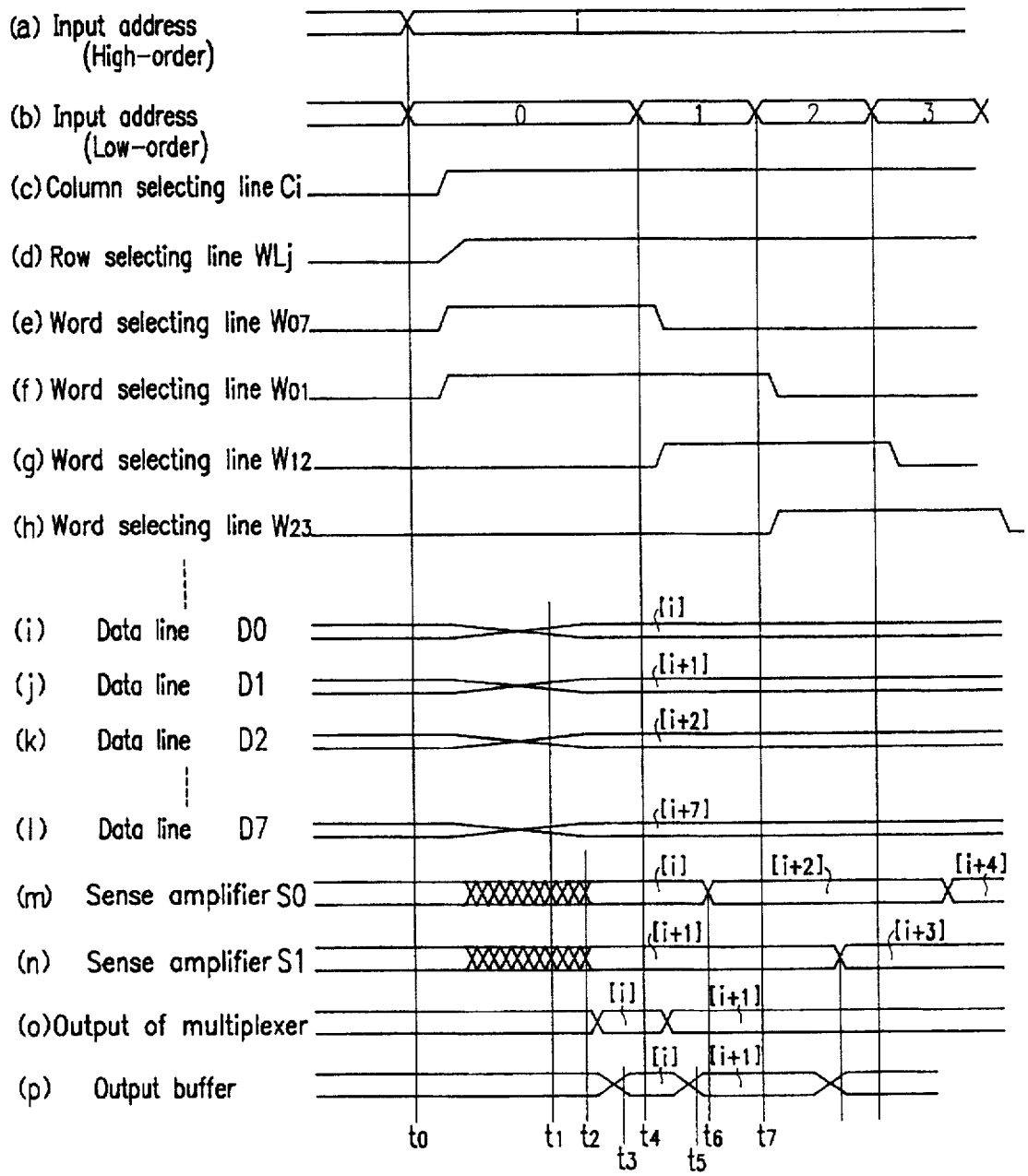
FIG. 3 is a timing chart for illustrating a read-out operation of the semiconductor memory device according to the present invention.
Figure 4:
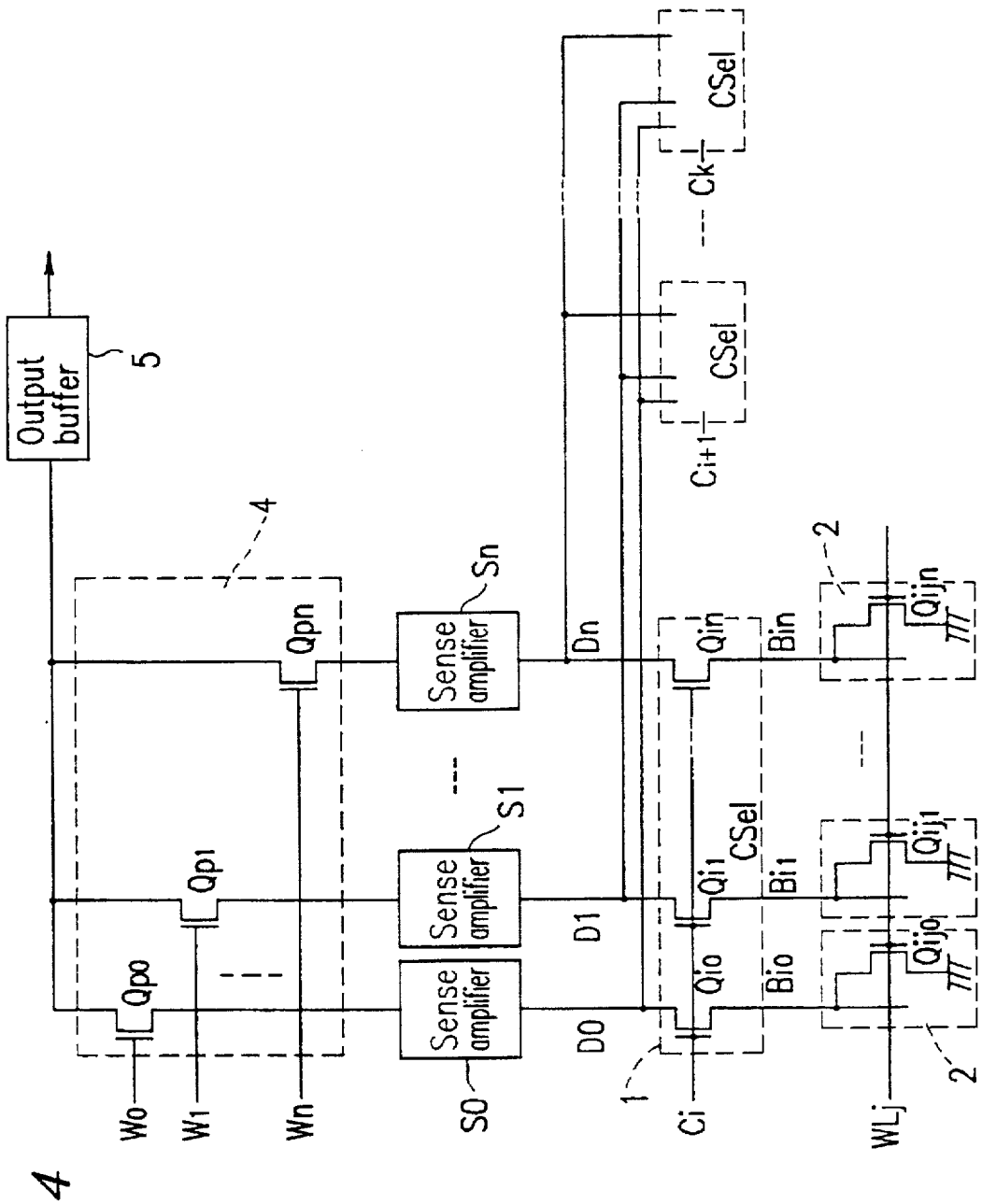
FIG. 4 is a circuit diagram showing the configuration of a semiconductor memory device according to a first conventional example.
Figure 5:
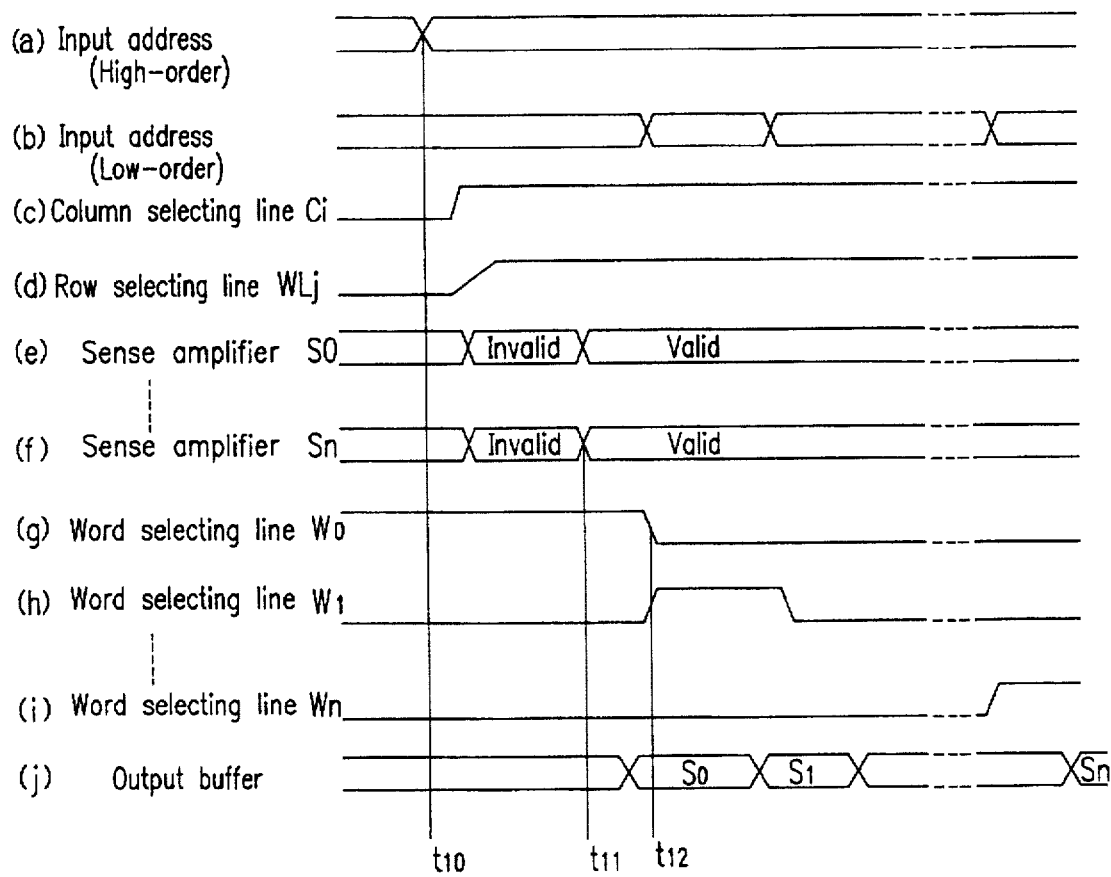
FIG. 5 is a timing chart for illustrating a read-out operation of the semiconductor memory device according to the first conventional example.
Figure 6:
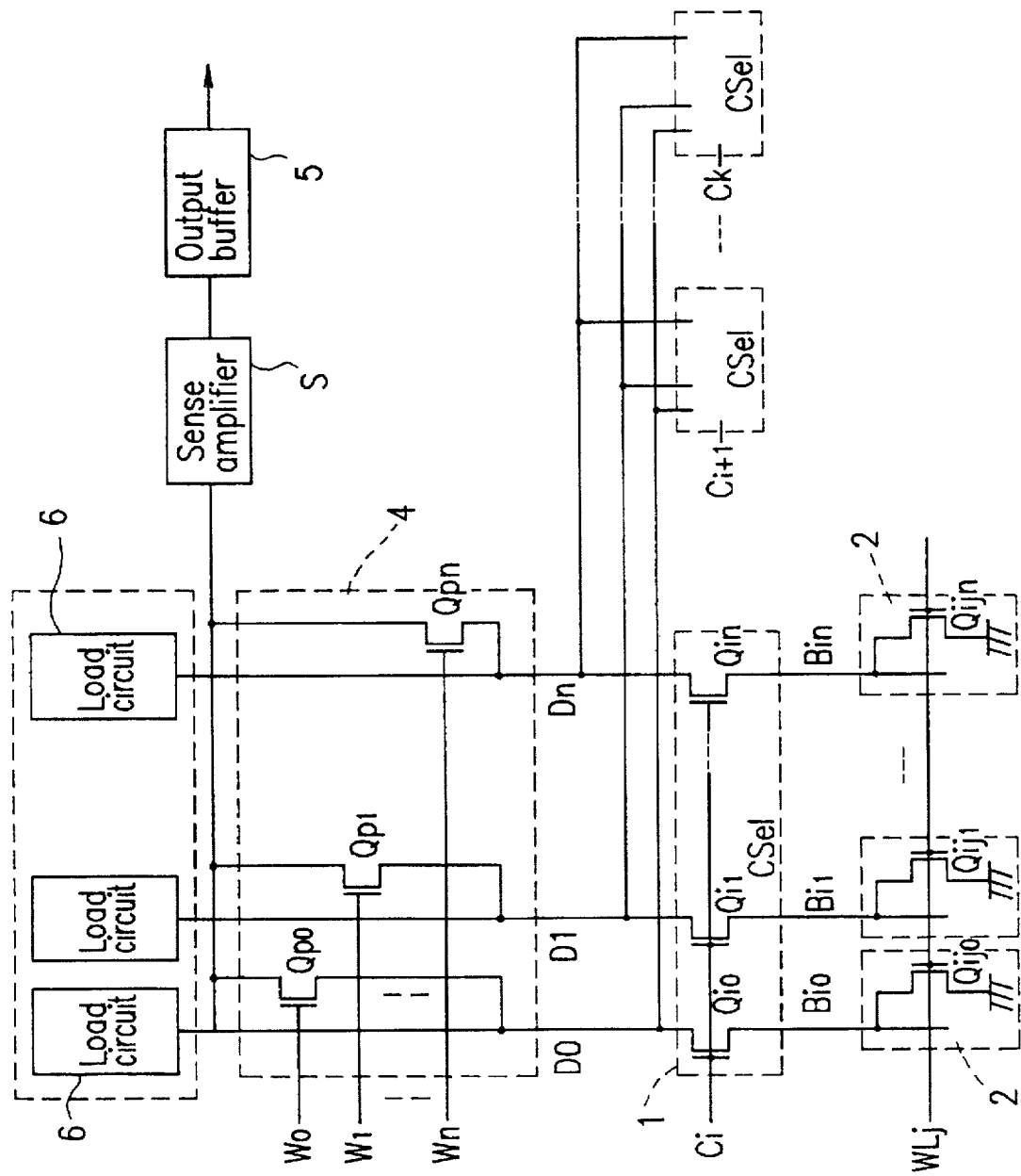
FIG. 6 is a circuit diagram showing a semiconductor memory device according to a second conventional example.
Figure 7:
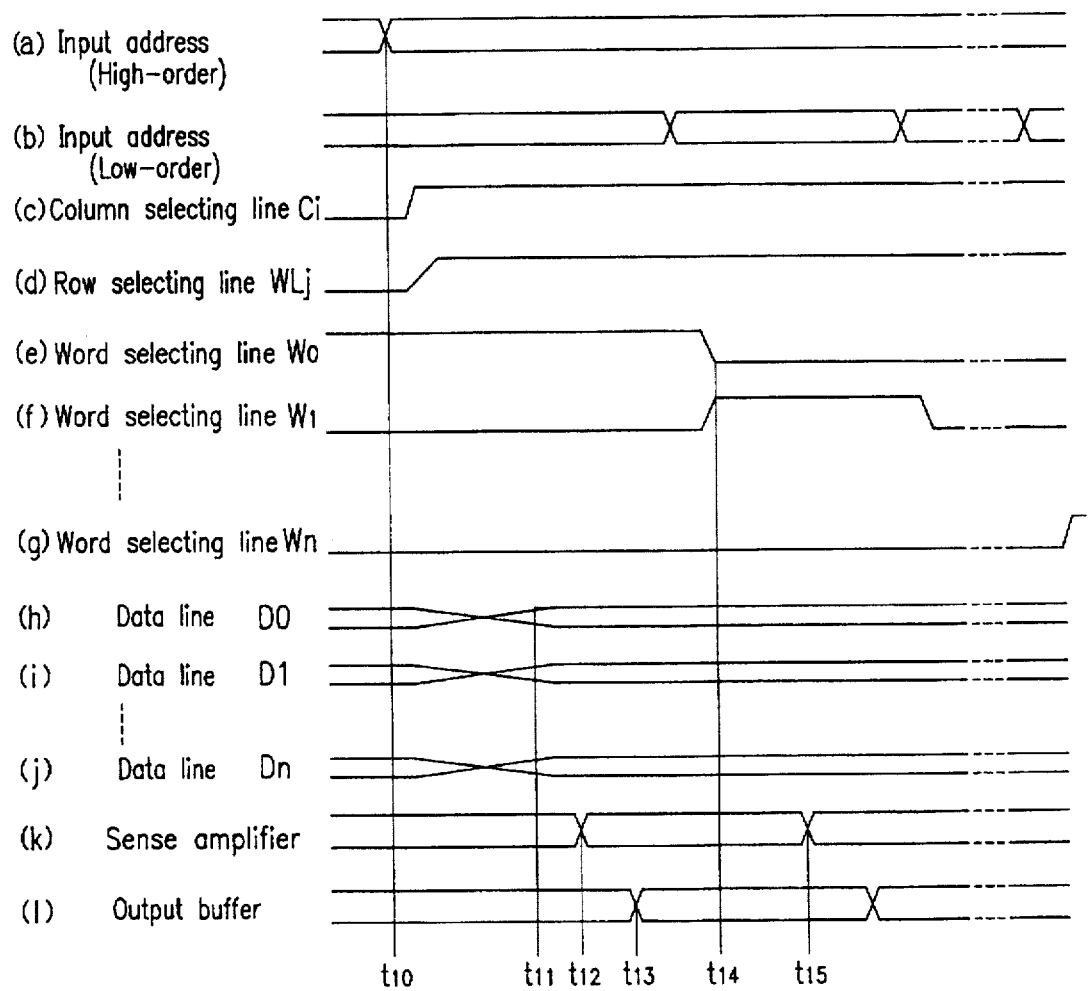
FIG. 7 is a timing chart for illustrating a read-out operation of the semiconductor memory device according to the second conventional example.

FIG. 1 shows the configuration of a circuit of a semiconductor memory device according to the present invention. FIG. 2 shows the configuration of a decoder circuit to be used with the semiconductor memory device in FIG. 1, for selecting a word in a page. FIG. 3 is a timing chart of the read-out operation of the semiconductor memory device in FIG. 1. In FIG. 1, like components are denoted by like reference numerals as in FIG. 6 for simplification.

The schematic configuration of the semiconductor memory device in FIG. 1 will be now described below.

A plurality of memory cells 2 are connected at the intersections of eight data lines $D_0$ to $D_7$ and one of the row selecting lines (the word lines) $WL_j$, respectively. The data lines $D_0$ to $D_7$ are selectively connected to two sense amplifiers $S_0$ and $S_1$ via the column selecting circuit 1 and the switching circuit 4. The data lines $D_0$ to $D_7$ are also connected to a corresponding number of load circuits 6 via the column selecting circuit 1. The column selecting circuit 1 is provided with eight selecting transistors $Qi_0$ to $Qi_7$ for one column selecting line $C_i$.

Although not illustrated in the figures, in addition to the column selecting line $C_i$, a plurality of column selecting lines $C_{i+1}, \ldots C_k$ are provided. Each of the column selecting lines $C_{i+1}, \ldots C_k$ is also connected to the data lines $D_0$ to $D_7$ similarly with the illustrated column selecting line $C_i$.

Similarly, although not illustrated in the figures, in addition to the row selecting line $WL_j$, a plurality of row selecting lines are provided. Each of the row selecting lines is also connected to the data lines $D_0$ to $D_7$, similar to the illustrated row selecting line $WL_j$. Furthermore, the memory cells are similarly provided in association with the other row selecting lines.

In the above configuration, one of the row selecting lines (the word lines) $WL_j$ and one of the column selecting lines $C_i$ are specified to simultaneously select a plurality of memory cells 2. Then, the potentials of the data lines $D_0$ to $D_7$ respectively connected to the thus selected memory cells 2 gradually change by the respective load circuits 6 in accordance with ON/OFF states of the respective memory cells 2. When the potentials of these data lines $D_0$ to $D_7$ are made valid, the data lines $D_0$ to $D_7$ are selectively connected to the sense amplifiers $S_0$ and $S_1$ by the switching circuit 4.

As shown in FIG. 2, the semiconductor memory device according to the present invention uses, as addresses for a page mode, lower-order address signals $A_0$, $A_1$ and $A_2$ among address signals $A_0$ to $A_n$. As shown in portions (a) and (b) of FIG. 3, when the higher-order address signals and the lower-order address signals are input at time t0, the semiconductor memory device performs a normal random access operation as a normal mode. When one of the row selecting lines $WL_j$ and one of the column selecting lines $C_i$ are specified by decoding higher-order bits of the input address, a plurality of memory cells 2 are simultaneously selected.

As in the second conventional example, each of the memory cells 2 of the semiconductor memory device of the present invention is constituted by using one MOSFET (hereinafter, referred to simply as the transistor) $Qij_0$ to $Qij_7$. Each of the transistors $Qij_0$ to $Qij_7$ is constituted using the semiconductor fabrication process, so that a threshold voltage thereof is boosted in the case where a logic state of "1" is to be stored therein and a threshold voltage becomes the same level as that in a normal enhancement mode in the case where a logic state of "0" is to be stored. In this manner, when one of the row selecting lines $WL_j$ is set at the High level by specifying the particular row selecting line $WL_j$, the transistors $Qij_0$ $Qij_7$ of the corresponding memory cells 2 are set to be in the normally OFF state ("1") or in the normally ON state ("0") in accordance with the respective logic states of the transistors $Qij_0$ to $Qij_7$. Accordingly, the potentials of the bit lines $Bi_0$ to $Bi_7$ selected by the column selecting line $C_i$ gradually change to be at the High level ("1") or at the Low level ("0") in accordance with the logic states of the corresponding transistors $Qij_0$ to $Qij_7$. These very small potentials are transmitted to the data lines $D_0$ to $D_7$ via the bit lines $Bi_0$ to $Bi_7$ and the transistors $Qi_0$ to $Qi_7$ of the row selecting circuit 1. As a result, the potentials of the data lines $D_0$ to $D_7$ are made valid by the memory cells 2 and the load circuits 6 at time t1 (see portions (i), (j) and (k) of FIG. 3).

On the other hand, when the lower-order address signals are input, only a $Y_0$ signal among selecting signals $Y_0$ to $Y_7$ is activated (i.e., set at the "Low" level=0) by the decoder circuit 7 which is shown in FIG. 2. As a result, a word selecting line $W_{01}$ in addition to a word selecting line $W_{07}$ is activated (i.e., set at the "High" level=1), as shown in FIG. 2 as well as portions (e) and (f) of FIG. 3. Then, the corresponding transistor $Qp_0$ of the switching circuit 4 is turned ON, so that the corresponding data line $D_0$ is selectively connected to the sense amplifier $S_0$. The sense amplifier $S_0$ amplifies the potential of the selected data line $D_0$. As a result, the output of the selected data line $D_0$ is made valid at time t2 (see a portion (m) of FIG. 3).

At this point of time, the word selecting line $W_{01}$ has also already been active (i.e., at the "High" level =1). Therefore, the transistor $Qp_1$ of the switching circuit 4 connected to the word selecting line $W_{01}$ is turned ON. As a result, the data line $D_1$ is selectively connected to another sense amplifier $S_1$. In the similar manner with the sense amplifier $S_0$, the sense amplifier $S_1$ amplifies the potential of the data line $D_1$. The output of the data line $D_1$ is then made valid at time t2 (see a portion (n) of FIG. 3).

At this time, the sense amplifiers $S_0$ and $S_1$ are connected to the output buffer 5 via an output selector. The output selector can be a multiplexer 3. The multiplexer 3 as the output selector transmits the output of the sense amplifier $S_0$ to the output buffer 5 based on a selection control signal supplied from a controller (not shown). As a result, the output of the output buffer 5 is made valid at time t3 (see a portion (p) of FIG. 3).

Subsequently, as shown in a portion (b) of FIG. 3, a next address is input as the lower-order address signal at time t4. Then, the state of the $Y_0$ signal is changed from the active state to the inactive state (i.e., is set at "High" level=1) while the state of the $Y_1$ signal is changed from the inactive state to the active state (i.e., is set at the "Low" level=0) by the decoder circuit 7. As a result, the data line $D_1$ is connected to the sense amplifier $S_1$ via the transistor $Qp_1$ of the switching circuit 4 while the word selecting line $W_{01}$ remains active (i.e., at the "High" level=1). Therefore, the output of the sense amplifier $S_1$ is transmitted to the output buffer 5 via the multiplexer 3 so as to be made valid at time t5 (see a portion (p) of FIG. 3).

Since the $Y_1$ signal is activated (i.e., set at the "Low" level=0) in parallel with the deactivation of the $Y_0$ signal, the word selecting line $W_{07}$ is deactivated (i.e., set at the "Low" level=0) and the word selecting line $W_{12}$ is activated (i.e., set at the "High" level=1). Consequently, the transistor $Qp_0$ of the switching circuit 4 is turned OFF while the transistor $Qp_2$ is turned ON. In this state, the sense amplifier $S_0$ is disconnected from the data line $D_0$, but instead is connected to the data line $D_2$. As a result, the sense amplifier $S_0$ amplifies the potential of the data line $D_2$, thereby making the output of the sense amplifier $S_0$ valid at time t6.

Subsequently, the data stored in the same page can be successively read by the similar operation.

As described above, according to the aforementioned circuit configuration, the semiconductor memory device of the present invention includes the two sense amplifiers $S_0$ and $S_1$. The data stored in one of the memory cells is amplified to be transmitted to the output buffer 5 via the data line connected to one of the sense amplifiers $S_0$ (or $S_1$). In parallel with this operation, i.e., the transmission of the stored data to the output buffer 5, data stored in a next memory cell is amplified via the data line connected to another sense amplifier $S_1$ (or $S_0$) so as to be made valid. In this manner, after the data stored in one of the memory cell is transmitted to the output buffer 5, the data stored in the next memory cell can be subsequently transmitted to the output buffer 5.

Owing to such a configuration, the delay time period for successively transmitting data can be remarkably reduced as compared with the aforementioned second conventional example where the sum of the delay time period related for the sense amplifier and the delay time period related to the output buffer is required for every transmission of the data stored in the memory cells to the output buffer 5. Accordingly, the reading speed can be remarkably improved.

According to the semiconductor memory device of the present invention, in order to successively read out the data stored in the same page, the sense amplifier circuits can be operated based on the valid data line in parallel with the operation of the output buffer circuit receiving an output of the sense amplifier circuit. Therefore, the total delay time period can be remarkably reduced as compared with the aforementioned second conventional example where the sum of the delay time period related to the sense amplifier and the delay time period related to the output buffer is required for successively transmitting the data stored in the memory cells to the output buffer. Consequently, according to the present invention, the semiconductor memory device capable of successively reading out the data stored in the same page at high speed can be realized.

Additionally, according to the present invention, since it is sufficient to provide only two sense amplifiers in semiconductor memory devices. Thus, the increases in the chip occupying area and the power consumption can be minimized.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A semiconductor memory device comprising:
   a plurality of data lines;
   a plurality of column selecting lines, each of the column selecting lines being electrically connected to each of the data lines;
   a plurality of row selecting lines, each of the row selecting lines being electrically connected to each of the data lines;
   a plurality of memory cells arranged in a matrix, each of the memory cells being electrically connected to one of the data lines, one of the column selecting lines and one of the row selecting lines, wherein upon specifying a selected one of the row selecting lines and a selected one of the column selecting lines, a certain number of the memory cells are simultaneously selected;
   a plurality of load circuits, each of the load circuits being electrically connected to one of the data lines;
   two sense amplifier circuits; and
   a switching circuit for selectively connecting any two of the plurality of data lines electrically to the two sense amplifier circuits, respectively.

2. A semiconductor memory device according to claim 1, further comprising an output selecting means for selectively outputting an output signal of one of the two sense amplifier circuits.

3. A semiconductor memory device according to claim 1, wherein the number of the plurality of data lines is larger than the number of the sense amplifier circuits.

4. A semiconductor memory device according to claim 1, wherein the number of the plurality of load circuits is larger than the number of the sense amplifier circuits.

5. A semiconductor memory device according to claim 1, wherein each of the odd-numbered data lines is coupled to one of the two sense amplifier circuits via the switching circuit, and each of the even-numbered data lines is coupled to the other one of the two sense amplifier circuits via the switching circuit.

6. A semiconductor memory device comprising:
   a plurality of data lines;
   a plurality of column selecting lines, each of the column selecting lines being electrically connected to each of the data lines;
   a plurality of row selecting lines, each of the row selecting lines being electrically connected to each of the data lines;
   a plurality of memory cells arranged in a matrix, each of the memory cells being electrically connected to one of the data lines, one of the column selecting lines and one of the row selecting lines;
   a plurality of load circuits, each of the load circuits being electrically connected to one of the data lines;
   two sense amplifier circuits; and
   a switching circuit electrically connected to the plurality of data lines and to the two sense amplifier circuits wherein the switching circuit is configured for selectively connecting any two of the plurality of data lines electrically to the two sense amplifier circuits.

7. A semiconductor memory device according to claim 6, further comprising an output selector electrically connected to the two sense amplifier circuits.

8. A semiconductor memory device according to claim 7, wherein the output selector is configured for selectively outputting an output signal of one of the two sense amplifier circuits.

9. A semiconductor memory device according to claim 6, wherein upon specifying a selected one of the row selecting lines and a selected one of the column selecting lines, a certain number of the memory cells are simultaneously selected.

10. A semiconductor memory device according to claim 6, wherein the number of the plurality of data lines is larger than the number of the sense amplifier circuits.

11. A semiconductor memory device according to claim 6, wherein the number of the plurality of load circuits is larger than the number of the sense amplifier circuits.

12. A semiconductor memory device according to claim 6, wherein each of the odd-numbered data lines is coupled to one of the two sense amplifier circuits via the switching circuit, and each of the even-numbered data lines is coupled to the other one of the two sense amplifier circuits via the switching circuit.

* * * * *